United States Patent [19]

Chang et al.

[11] Patent Number: 4,568,959

[45] Date of Patent: Feb. 4, 1986

[54] PHOTOMULTIPLIER

[75] Inventors: Leroy L. Chang, Goldens Bridge; Frank F. Fang, Yorktown Heights, both of N.Y.

[73] Assignee: International Business Machines Corporation, Armonk, N.Y.

[21] Appl. No.: 500,502

[22] Filed: Jun. 2, 1983

[51] Int. Cl.⁴ .................. H01L 27/14; H01L 31/00
[52] U.S. Cl. ................................. 357/30; 357/16
[58] Field of Search .............. 357/30, 16, 13, 61; 250/338 SE, 339, 370 R, 211 J

[56] References Cited

U.S. PATENT DOCUMENTS

| | | | |
|---|---|---|---|
| 3,889,284 | 6/1975 | Schiel | 357/30 |
| 3,995,303 | 11/1976 | Nahory et al. | 357/30 |
| 4,053,920 | 10/1977 | Enstrom | 357/30 |
| 4,171,996 | 10/1979 | Maslov et al. | 148/175 |
| 4,206,002 | 6/1980 | Sabnis et al. | 136/89 |
| 4,250,515 | 2/1981 | Esaki et al. | 357/16 |
| 4,250,516 | 2/1981 | Worlock | 357/16 |

Primary Examiner—James W. Davie
Assistant Examiner—Georgia Y. Epps
Attorney, Agent, or Firm—Alvin J. Riddles

[57] ABSTRACT

A semiconductor structure is provided with progressively changing band gap in a plurality of stages each at an abrupt interface with an asymmetry in the band gap widths such that the major difference in energy gap discontinuity is in the band favoring a particular type of carrier. The transition regions between the progressive material sections are smaller than the carrier mean free path so as to provide kinetic energy for efficient carrier multiplication with reduced noise as the carriers traverse through the device.

5 Claims, 2 Drawing Figures

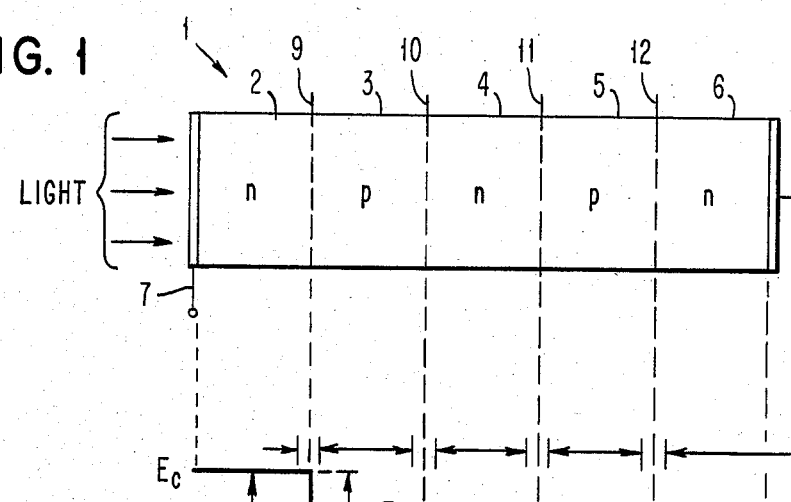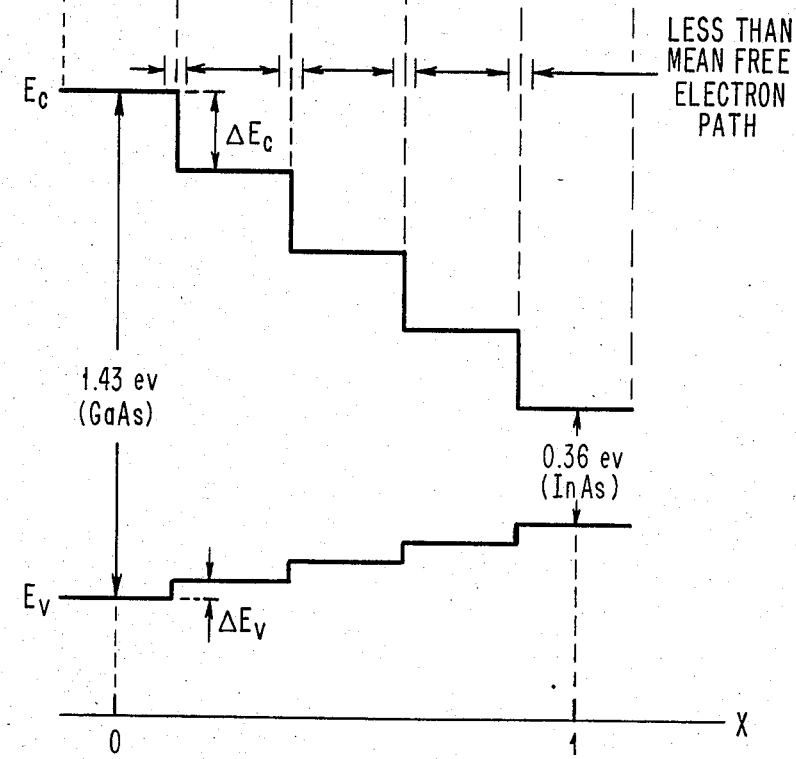

PHOTOMULTIPLIER

The government has rights in this invention pursuant to Contract No. DAAG 29-81-C-0038 awarded by the U.S. Army Research Office.

DESCRIPTION

1. Technical Field

The field of the invention is that of semiconductor structures which take light energy and convert it to electrical signals. There are a number of structures of this type wherein efficiency in conversion of a band of wavelengths is achieved with multiple layers wherein each layer has a different light wavelength responsiveness.

2. Background Art

It has been found in the art that as the interface between layers becomes more abrupt impact ionization will provide a multiplication effect.

U.S. Pat. Nos. 3,995,303 and 4,250,516 each show such multilayer structures wherein there is a relatively abrupt transition between regions that produce impact ionization as the dominant mechanism for carriers. One of the disadvantages however with the impact ionization mechanism is that considerable noise is generated which degrades the performance of the photodetector.

BRIEF DESCRIPTION OF THE DRAWINGS

FIG. 1 is a schematic illustration of a five stage semiconductor photodetector in accordance with the invention.

FIG. 2 is a dimensionally correlated band energy diagram for the material $(Ga_xIn_{1-x})As$.

DISCLOSURE OF THE INVENTION

The photodetector of the invention provides structural properties that produce more carriers by impact ionization in the crystalline environment wherein a particular type of carrier is favored. The structure is a monocrystalline semiconductor having a progressively decreasing band gap with distance away from a light receiving surface. The structure has different light wavelength responsive layers, each with a progressively narrower band gap with distance from the light receiving surface, with each heterojunction layer interface being so abrupt that the transition is within the mean free path of a carrier. The materials of the structure are so selected that most of the change in band gap at each interface favors the predominant carrier type in the structure.

The structure of the invention has a reduced defect propagation in the crystal and has no potential wells in the carrier path to trap low energy carriers so that the structure will provide a higher gain, wider band photoresponse, a faster turn-off, and the thickness requirements of each layer will be less stringent.

The semiconductor materials are such that there is an asymmetry in the progressively step decreasing of the energy gap that favors a particular carrier. Where at an individual step most of the change in energy gap is in the conduction band, the asymmetry will be such as to favor electrons. Similarly, where most of the change is in the valence band, then the asymmetry will favor holes. The materials are chosen so that the asymmetry favors the predominant carriers.

BEST MODE FOR CARRYING OUT THE INVENTION

Referring to FIG. 1, a semiconductor monocrystalline structure 1 is provided with a series of progressively lower band gap regions with five shown as an example labelled 2, 3, 4, 5 and 6. A transparent electrode 7 is provided on the light incident surface of section 2 and an ohmic contact 8 is provided on the back surface of the region 6 in order to apply a bias and to conduct the output signal.

Each layer 2 through 6 is essentially intrinsic or high resistivity and is of a thickness of the order of the absorption length of the wavelength in the band of wavelengths in the incident light that is to be absorbed by that particular layer.

The structure is designed so that there is an abrupt interface, shown as dotted lines 9, 10, 11 and 12 between each adjacent section. Each of the heterojunction interfaces is such that the entire transition occurs over a linear distance of the order of the mean free path of the predominant carrier.

In order to facilitate explanation the description will be provided in terms of particular semiconductor materials and specifications but it will be readily apparent in the light of the principles set forth that other materials and specifications can be employed.

The preferred material where the predominant carriers are electrons is $(Ga_xIn_{1-x})As$ wherein the GaAs has the larger band gap of 1.43 electron volts which band gap decreases with the increase in x of Indium to 0.36 electron volts for InAs. The material has band gap variation asymmetry in that the majority of the difference in band gap is in the conduction band. The step transition at each layer interface is within the mean free path of the carriers in most materials and is of the order of and preferably less than 50Å. The semiconductor material is essentially intrinsic having a doping density of around and preferably less than $10^{14}$ impurity atoms per cc.

Referring next to FIG. 2 which is a dimensionally correlated energy band diagram with the structure of FIG. 1. The widest band gap is shown adjacent the light incident surface through transparent electrode 7 and there is an abrupt, less than 50Å distance change $\Delta E_c + \Delta E_v$ at each of the interfaces 9, 10, 11 and 12 to progressively smaller band gaps with the smallest band gap being the deepest in the semiconductor. While five layers are shown, more or less may be used to convert as many wavelengths in the band of incident light as is desired. In the preferred material where the dominant carriers are to be electrons the region 2 would be pure GaAs with an energy gap of 1.43eV. At the interface or heterojunction 9, there would be an abrupt change to $(Ga_{0.75}In_{0.25})As$ and the abrupt change at the interface 9 would occur over a linear dimension of about 50Å so that no inelastic scattering would take place in this transition region. Thus, the photogenerated electrons in traversing from region 2 to region 3 will gain kinetic energy equivalent to the increase in conduction band ($\Delta E_c$) of the transition region. This kinetic energy gain is the predominant mechanism for carrier multiplication by impact ionization. There will be a similar gain of kinetic energy between successive steps at the transition regions 9, 10, 11 and 12 in FIG. 1. At the interface 10 between regions 3 and 4, there would again be another abrupt change to $(Ga_{0.5}In_{0.5})As$ and again at the interface 11 there would be an abrupt change to $(Ga_{0.25}In_{0.7-}$ 5)As and lastly, at the interface 12 the material would change to pure InAs. As may be seen from the line at the bottom of FIG. 2, the In variable x increases in the direction away from the light incident surface of the crystal.

Referring further to FIG. 2, the $\Delta E_c$ in the energy diagram is greater than $\Delta E_v$. This provides a built-in asymmetry which favors electrons as carriers. In other words, $\Delta E_c$ is substantially greater than $\Delta E_v$ for this $(Ga_xIn_{1-x})As$ material so that the energy gain by the carriers that traverse the entire region is much greater for electrons than for holes. The asymmetry that favors a particular carrier is a property that at this point in the art has not been reported as being predictable from other properties of the material however it can be readily measured. In ternary compounds of the type $(A_xB_{1-x})C$, it is preferable that the energy band discontinuity be at least a two-to-one change favoring the predominant carrier. In other words, for electrons $\Delta E_c$ should be at least twice $\Delta E_v$. The condition for predominately one carrier operation is true with or without external bias, although the presence of an external bias applied between contacts 7 and 8 will enhance the operation.

In the carrier multiplication regime, the probability of ionization by electrons is much higher than that by holes where the greater band energy change is in the conduction band rather than the valence band. This will be of particular value in reducing noise. Since a noise figure associated with a carrier multiplication factor of M is proportional to $M^3$ and $M^2$, where $M^3$ is the figure for electrons and holes whereas $M^2$ is the figure for only electrons or holes. For photodetectors operating in the impact ionization or avalanche mode, M will always be greater than unity.

Thus, the structure of the invention will offer a much improved signal to noise ratio compared to conventional homojunction devices and it will have comparable ionization rates for electrons or holes.

While the structure thus far has been described for convenience in terms of electrons being the predominant carrier, the principles of the invention may be applied by one skilled in the art readily to a structure involving holes as the dominant ionized carrier. For this purpose, a different $(A_xB_{1-x})C$ material would be chosen. The criteria would be the difference in band gap as A and B are varied and the asymmetry would be such that most of the change would be in the valence band. An example material is $Ga(Sb_xAs_{1-x})$. Here, the energy gap would vary from 1.43 eV for GaAs to 0.81 eV for GaSb and the difference would occur almost entirely in the valence band, in other words, $\Delta E_v$ would be at least twice as great as $\Delta E_c$.

The structures can be conveniently fabricated by the technique of molecular beam epitaxy which is favored because of its demonstrated capability of growing high quality thin films of precise compositional and thickness control with smooth and abrupt interfaces although any technique wherein the interface could be achieved over a linear dimension of less than 50Å would be sufficient to produce the features desired by the invention.

What has been described is a semiconductor structure wherein photo-generated carriers are amplified by impact ionization in a very abrupt interface and a particular type of predominant carrier is favored by an asymmetry in the variation in band gap. The impact ionization process is greatly enhanced by the carriers gaining kinetic energy at the successive heterojunction steps which have transition regions less than the carrier mean free path. The successively varied gap in these heterostructures further provides high quantum efficiency for a broad spectrum of optical signals.

Having thus described out invention, what we claim as new and desire to secure by Letters Patent is:

1. In a converter of light to electrical signals employing a plurality of abutting regions of monocrystalline semiconductor material of alternating opposed conductivity type having a progressively decreasing band gap in a direction away from a light incident surface, the improvement for providing multiplied photo-produced carriers comprising decreasing said band gap in a series of step corresponding to said abutting regions, each said step being of the order of less than the mean free path of an electron in said direction away from said light incident surface and the predominant change in band gap being in the band that favors a specific carrier type.

2. The converter of claim 1 wherein the favored carrier is electrons and the conduction band discontinuity is larger than the valence band discontinuity at each of said steps.

3. The converter of claim 1 wherein the favored carrier is holes and the valence band discontinuity is much larger than the conduction band discontinuity at each of said steps.

4. The converter of claim 2 wherein said semiconductor material is $(Ga_xIn_{1-x})As$ where x varies from 0 to 1 at in essentially 0.25 increments at each successive said step.

5. The converter of claim 3 wherein said material is $Ga(Sb_xAs_{1-x})$ where x varies from 0 to 1 at in essentially 0.25 increments at each successive said step.

* * * * *